(12) United States Patent
Suzuki

(10) Patent No.: US 9,461,036 B2
(45) Date of Patent: Oct. 4, 2016

(54) SEMICONDUCTOR DEVICE

(71) Applicant: Renesas Electronics Corporation, Kanagawa (JP)

(72) Inventor: Hisamitsu Suzuki, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/679,051

(22) Filed: Apr. 6, 2015

(65) Prior Publication Data

US 2015/0303189 A1 Oct. 22, 2015

(30) Foreign Application Priority Data

Apr. 21, 2014 (JP) ................................. 2014-087027

(51) Int. Cl.
```
H01L 29/66      (2006.01)
H01L 27/06      (2006.01)
H01L 29/78      (2006.01)
H01L 29/732     (2006.01)
H01L 29/08      (2006.01)
H01L 29/06      (2006.01)
H01L 21/8249    (2006.01)
```
(52) U.S. Cl.
CPC ....... *H01L 27/0623* (2013.01); *H01L 29/0657* (2013.01); *H01L 29/0804* (2013.01); *H01L 29/66272* (2013.01); *H01L 29/732* (2013.01); *H01L 29/7851* (2013.01); *H01L 21/8249* (2013.01)

(58) Field of Classification Search
CPC .................................................. H01L 27/0623
USPC ......................................................... 257/378
See application file for complete search history.

(56) References Cited

U.S. PATENT DOCUMENTS

| | | |
|---|---|---|
| 8,482,081 B2 | 7/2013 | Tanaka |
| 2005/0184361 A1 | 8/2005 | Sasaki |
| 2011/0147840 A1 | 6/2011 | Cea et al. |

FOREIGN PATENT DOCUMENTS

| | | |
|---|---|---|
| JP | 5-90278 A | 4/1993 |
| JP | 2005-236084 A | 9/2005 |
| JP | 2007-165780 A | 6/2007 |
| JP | 2011-119344 A | 6/2011 |
| JP | 2013-511852 A | 4/2013 |

*Primary Examiner* — Anthony Ho

(74) *Attorney, Agent, or Firm* — Mattingly & Malur, PC

(57) ABSTRACT

A semiconductor device which uses a fin-type semiconductor layer to form a bipolar transistor. The substrate of the device is a semiconductor substrate. A collector is a first-conductivity type impurity region which is formed in the semiconductor substrate. A base is a second-conductivity type impurity region which is formed in the surface layer of the collector. A first semiconductor layer is a fin-type semiconductor layer which lies over the base. An emitter is formed in the first semiconductor layer and its bottom is coupled to the base. A first contact is coupled to the collector, a second contact is coupled to the base, and a third contact is coupled to the emitter.

5 Claims, 23 Drawing Sheets

A-A'

A-A'

SEMICONDUCTOR DEVICE

CROSS-REFERENCE TO RELATED APPLICATIONS

The disclosure of Japanese Patent Application No. 2014-087027 filed on Apr. 21, 2014 including the specification, drawings and abstract is incorporated herein by reference in its entirety.

BACKGROUND

The present invention relates to semiconductor devices and more particularly to technology for a semiconductor device having a bipolar transistor.

In making an electric circuit in a semiconductor substrate, a bipolar transistor may be provided in the semiconductor substrate. For example, Japanese Unexamined Patent Application Publications Nos. Hei 5(1993)-90278, 2005-236084, and 2011-119344 describe that a bipolar transistor is formed by stacking an impurity layer to become an emitter, an impurity layer to become a base, and an impurity layer to become a collector in the thickness direction of the semiconductor substrate.

In recent years, in order to miniaturize a FET (Field Effect Transistor), a fin-type semiconductor layer is used in the FET forming process (for example, see Japanese Unexamined Patent Application Publications No. 2007-165780 and Japanese Translation of PCT International Application Publication No. JP-T-2013-511852).

SUMMARY

The present inventors have explored a technique of forming a bipolar transistor using a fin-type semiconductor layer. The above and further objects and novel features of the invention will more fully appear from the following detailed description in this specification and the accompanying drawings.

According to an aspect of the present invention, there is provided a semiconductor device which includes a substrate, a first first-conductivity type region, a second-conductivity type region, a first semiconductor layer, a second first-conductivity type region, a first contact, a second contact, and a third contact. The substrate is a semiconductor substrate. The first first-conductivity type region is a first-conductivity type impurity region which is formed in the substrate. The second-conductivity type region is a second-conductivity type impurity region which is formed in the surface layer of the first first-conductivity type region. The first semiconductor layer is a fin-type semiconductor layer which is located over the second-conductivity type region. The second first-conductivity type region is formed in the first semiconductor layer with its bottom coupled to the second-conductivity type region. The first contact is coupled to the first first-conductivity type region, the second contact is coupled to the second-conductivity type region, and the third contact is coupled to the second first-conductivity type region.

According to another aspect of the present invention, there is provided a semiconductor device in which a first semiconductor layer over a substrate includes a first first-conductivity type region, a second first-conductivity type region, and a second-conductivity type region. The second first-conductivity type region is spaced from the first first-conductivity type region. The second-conductivity type region couples the first first-conductivity type region and the second first-conductivity type region.

According to the present invention, a bipolar transistor can be formed using a fin-type semiconductor layer.

BRIEF DESCRIPTION OF THE DRAWINGS

FIGS. 4A and 4B are views for explaining a semiconductor device manufacturing method, in which FIG. 4A is a perspective view and FIG. 4B is a sectional view;

FIGS. 5A and 5B are views for explaining the semiconductor device manufacturing method, in which FIG. 5A is a perspective view and FIG. 5B is a sectional view;

FIGS. 6A and 6B are views for explaining the semiconductor device manufacturing method, in which FIG. 6A is a perspective view and FIG. 6B is a sectional view;

FIGS. 7A and 7B are views for explaining the semiconductor device manufacturing method, in which FIG. 7A is a perspective view and FIG. 7B is a sectional view;

FIGS. 8A and 8B are views for explaining the semiconductor device manufacturing method, in which FIG. 8A is a perspective view and FIG. 8B is a sectional view;

FIGS. 9A and 9B are views showing variations of the semiconductor device, in which FIG. 9A shows the first variation and FIG. 9B shows the second variation;

FIGS. 15A and 15B are views for explaining a semiconductor device manufacturing method according to the third embodiment, in which FIG. 15A is a perspective view and FIG. 15B is a sectional view;

FIGS. 16A and 16B are views showing variations of the semiconductor device according to the third embodiment, in which FIG. 16A shows the first variation and FIG. 16B shows the second variation;

FIGS. 22A and 22B are sectional views showing variations of the semiconductor device according to the fifth embodiment, in which FIG. 22A shows the first variation and FIG. 22B shows the second variation;

DETAILED DESCRIPTION

Figure 1:
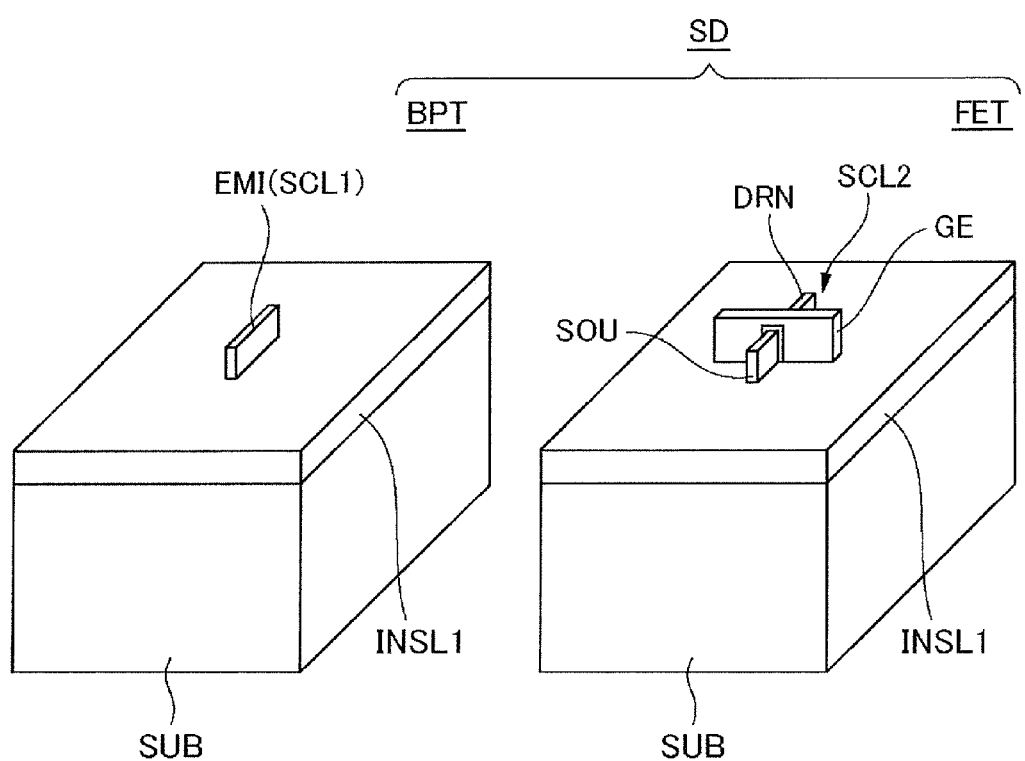
FIG. 1 is a perspective view showing the structure of a semiconductor device according to a first embodiment of the invention.

Next, the preferred embodiments of the present invention will be described referring to the accompanying drawings. In all the drawings, elements with like functions are designated by like reference numerals and repeated descriptions thereof are omitted as appropriate.

First Embodiment

Figure 2:
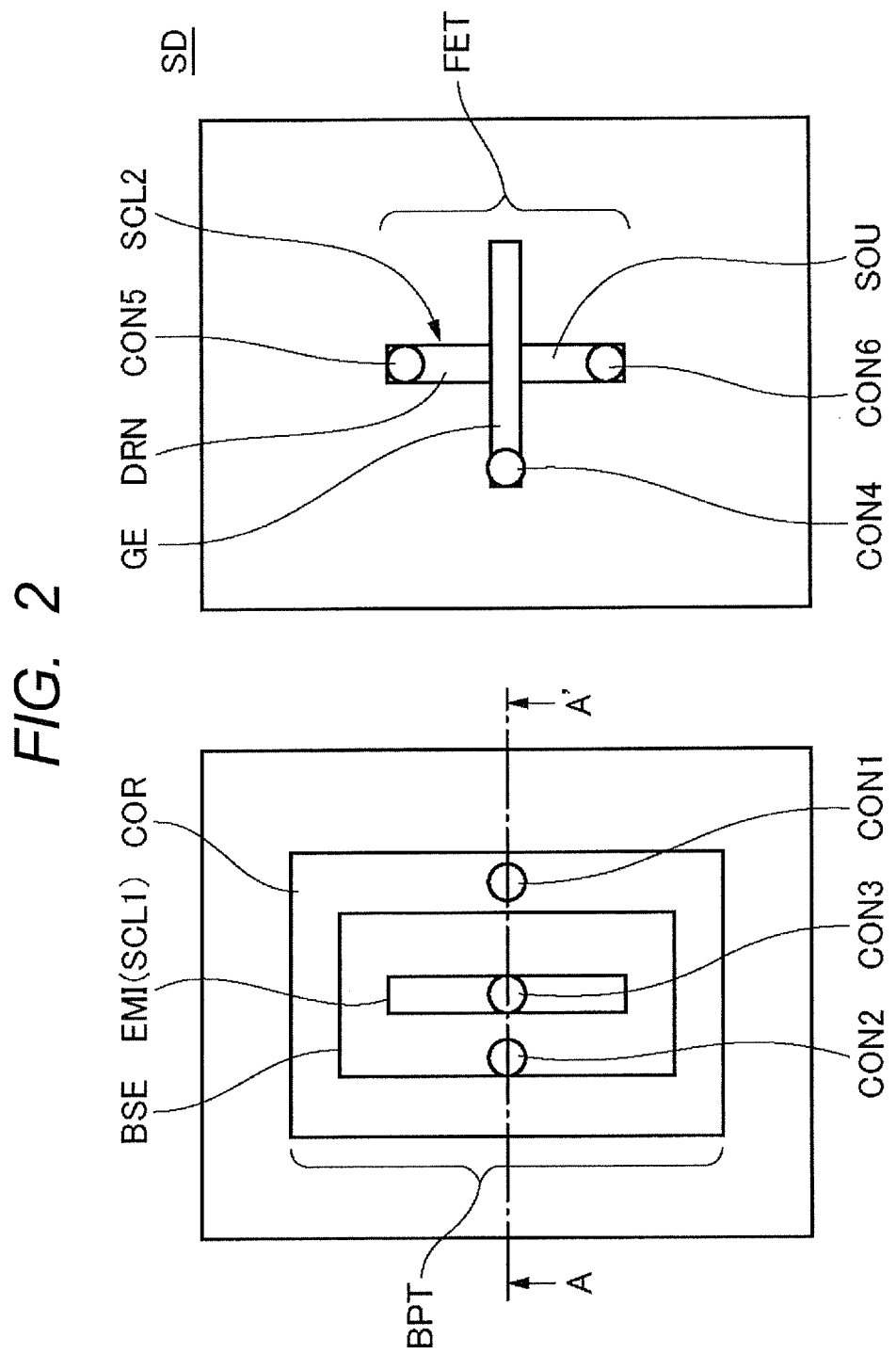
FIG. 2 is a plan view of the semiconductor device.
Figure 3:
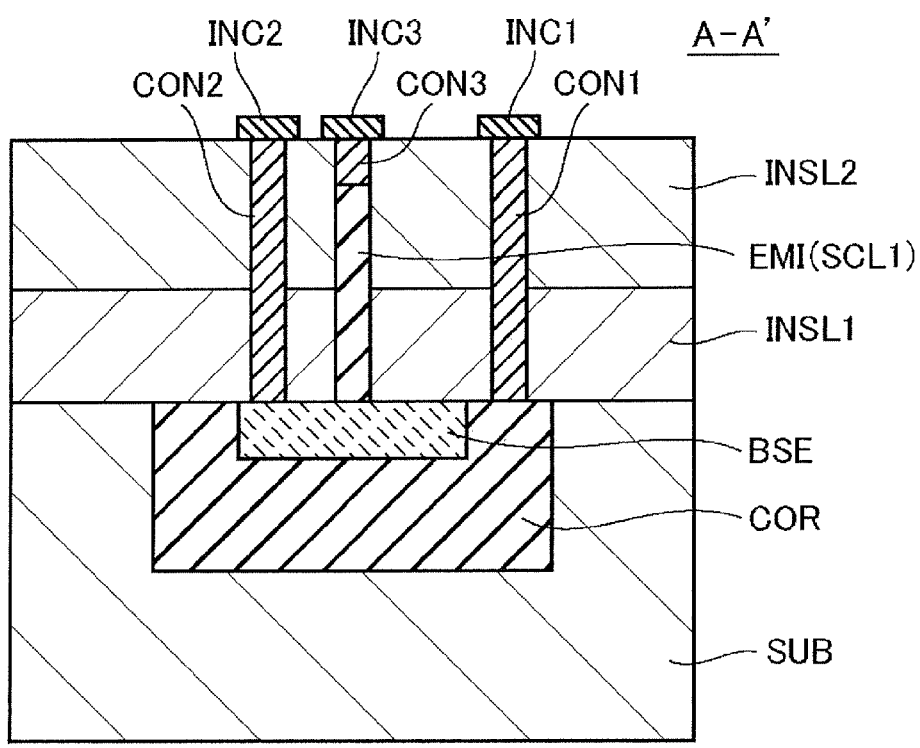
FIG. 3 is a sectional view taken along the line A-A' of FIG. 2.

FIG. 1 is a perspective view showing the structure of a semiconductor device SD according to the first embodiment. FIG. 2 is a plan view of the semiconductor device SD and FIG. 3 is a sectional view taken along the line A-A' of FIG. 2. For illustrative convenience, the layers above an insulating film INSL2 and contacts are omitted in FIG. 3. In FIG. 1, a substrate SUB including a bipolar transistor BPT and a substrate SUB including a field effect transistor FET are separately shown for illustrative convenience, but these are one and the same substrate SUB.

The semiconductor substrate SD according to this embodiment includes a substrate SUB, collector (first first-conductivity type region), base BSE (second-conductivity type region), first semiconductor layer SCL1, emitter EMI (second first-conductivity type region), first contact CON1, second contact CON2, and third contact CON3. The substrate SUB is a semiconductor substrate. The collector COR is a first-conductivity type impurity region which is formed in the substrate SUB. The base BSE is a second-conductivity type impurity region which is formed in the surface layer of the collector COR. The first semiconductor layer SCL1 is a fin-type semiconductor layer which lies over the base BSE. The emitter EMI is formed in the first semiconductor layer SCL1 with its bottom coupled to the base BSE. The first contact CON1 is coupled to the collector COR, the second contact CON2 is coupled to the base BSE, and the third contact CON3 is coupled to the emitter EMI. A detailed explanation is given below.

For example, the substrate SUB is a silicon substrate. A bipolar transistor BPT and a field effect transistor FET are formed on the same substrate SUB. In the example shown in FIGS. 1 to 3, the substrate SUB is a second-conductivity type substrate, for example, a p-type second-conductivity type substrate. In this case, the emitter EMI and collector COR of the bipolar transistor BPT are of the n-type. On the other hand, if the substrate SUB is an n-type semiconductor substrate, the emitter EMI and collector COR of the bipolar transistor BPT are of the p-type.

The bipolar transistor BPT is a vertical bipolar transistor which includes the emitter EM1, base BSE, and collector COR as mentioned above. The emitter EMI of the bipolar transistor BPT is formed using the fin-type first semiconductor layer SCL1. In the example shown in the figures, the first semiconductor layer SCL1 is a first-conductivity type semiconductor layer and the whole first semiconductor layer SCL1 configures the emitter EMI. The base BSE and collector COR are formed by implanting impurity ions into the substrate SUB. On the other hand, the emitter EMI is formed by implanting impurity ions into the first semiconductor layer SCL1 after the formation of the first semiconductor layer SCL1.

The field effect transistor FET is formed using a fin-type second semiconductor layer SCL2. Specifically, an insulating film INSL1 (for example, a silicon oxide film) is formed over the substrate SUB. The insulating film INSL1 is an element isolation film which has a smaller depth than the second semiconductor layer SCL2. Therefore, the second semiconductor layer SCL2 protrudes from the insulating film INSL1. The gate electrode GE of the field effect transistor FET lies over the insulating film INSL1, striding across part of the second semiconductor layer SCL2. It is preferable that the first semiconductor layer SCL1 and second semiconductor layer SCL2 extend in the same direction. The insulating film INSL1 also lies in the region of the substrate SUB in which the bipolar transistor BPT is formed.

A gate insulating film GINS lies between the second semiconductor layer SCL2 and gate electrode GE. The gate insulating film GINS is formed, for example, by thermally oxidizing the second semiconductor layer SCL2. The region of the second semiconductor layer SCL2 which is not covered by the gate electrode GE is doped with impurities. Consequently, a first impurity region to become a source SOU and a second impurity region to become a drain DRN are formed in the second semiconductor layer SCL2. In other words, the gate insulating film GINS and gate electrode GE lie between the first impurity region and second impurity region of the second semiconductor layer SCL2.

An insulating film INSL2 as an interlayer insulating film is formed over the insulating film INSL1. Contacts CON4, CON5, and CON6 as well as the first contact CON1, second contact CON2 and third contact CON3 are buried in the insulating film INSL1 and insulating film INSL2. The first contact CON1, second contact CON2, and third contact CON3 are coupled to the collector COR, base BSE, and emitter EMI, respectively. The contact CON4, contact CON5, and contact CON6 are coupled to the gate electrode GE, drain DRN, and source SOU, respectively. The arrangement of the contacts is not limited to the example shown in FIGS. 2 and 3.

A first interconnect INC1, second interconnect INC2, and third interconnect INC3 are formed over the insulating film INSL2. The first interconnect INC1, second interconnect INC2, and third interconnect INC3 are coupled to the first contact CON1, second contact CON2, and third contact CON3, respectively. The first interconnect INC1, second interconnect INC2, and third interconnect INC3 are formed, for example, by making a conductive film (for example, a metal film such as a tungsten film) over the insulating film INSL2 and removing the conductive film selectively. Alternatively, the first interconnect INC1, second interconnect INC2, and third interconnect INC3 may be formed by a damascene process.

Though not shown in the figures, a plurality of interconnects to be coupled to the contacts CON4, CON5, and CON6 are also formed over the insulating film INSL2. These interconnects are formed in the same process in which the first interconnect INC1 is formed.

Next, the method for manufacturing the semiconductor device SD will be described referring to FIGS. 4A to 8B. FIGS. 4A, 5A, 6A, 7A, and 8A are perspective views and FIGS. 4B, 5B, 6B, 7B, and 8B are sectional views corresponding to FIG. 3.

Figure 4A:
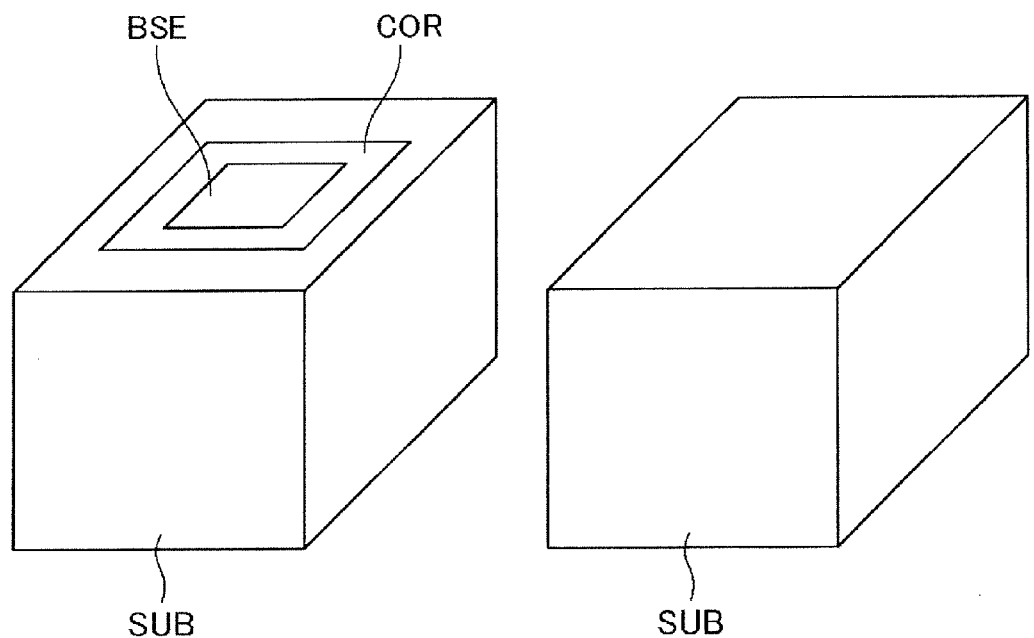
Figure 4B:
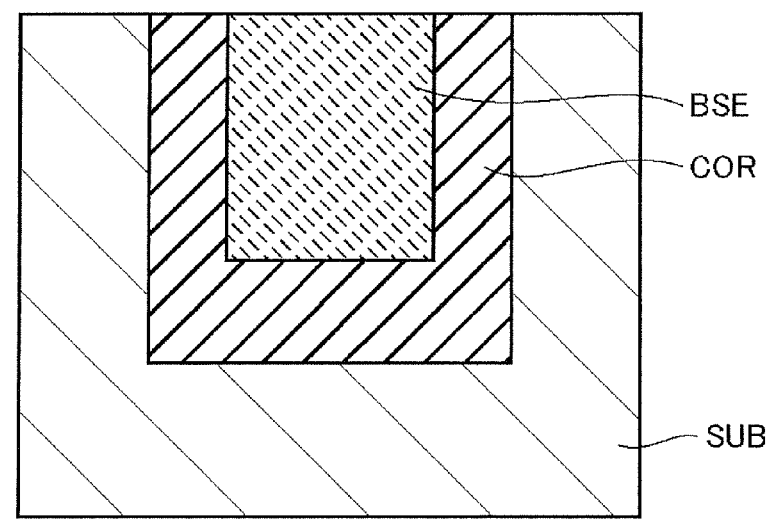

First, a second-conductivity type substrate SUB is provided as shown in FIGS. 4A and 4B. Then, a resist pattern (not shown) is made over the substrate SUB and using the resist pattern as a mask, first-conductivity type impurities (for example, P) are implanted into the substrate SUB. Consequently, a collector COR is formed. The dosage of impurities in this step is, for example, not less than $1\times10^{13}$ cm$^2$ and not more than $1\times10^{14}$ cm$^2$. After that, the resist pattern is removed.

Then, a resist pattern (not shown) is made over the substrate SUB and using the resist patter as a mask, second-conductivity type impurities (for example, B) are implanted into the substrate SUB. Consequently, a base BSE is formed. The dosage of impurities in this step is, for example, not less than $1\times10^{12}$ cm$^2$ and not more than $1\times10^{14}$ cm$^2$. After that, the resist pattern is removed.

Figure 5A:
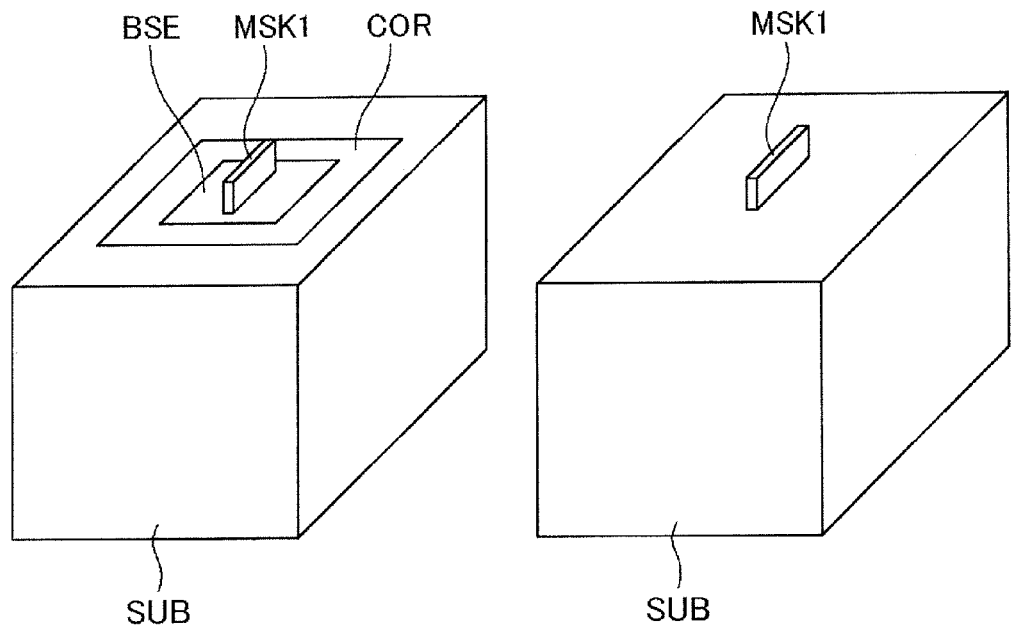
Figure 5B:
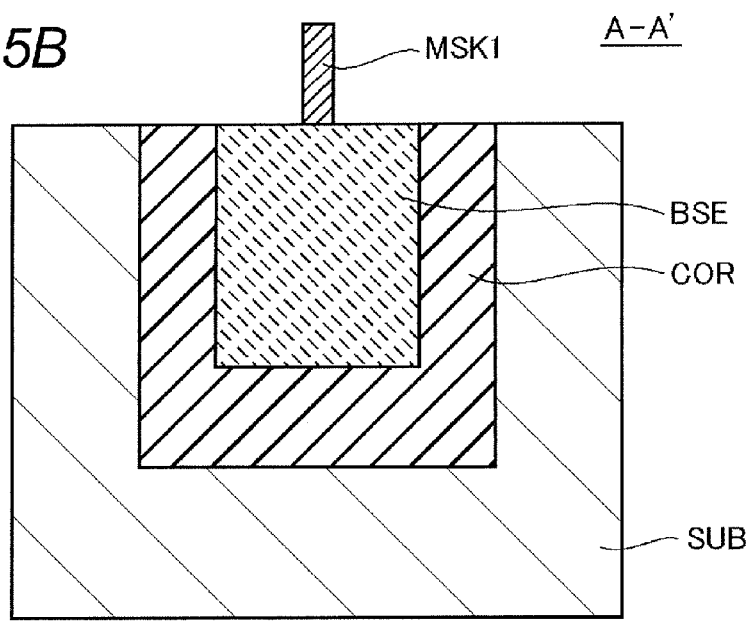

Then, a mask pattern MSK1, for example, a hard mask pattern of silicon nitride film is formed over the substrate SUB as shown in FIGS. 5A and 5B. The mask pattern MSK1 covers the region of the substrate SUB in which the first semiconductor layer SCL1 is to be formed, and the region of the substrate SUB in which the second semiconductor layer SCL2 is to be formed.

Figure 6A:
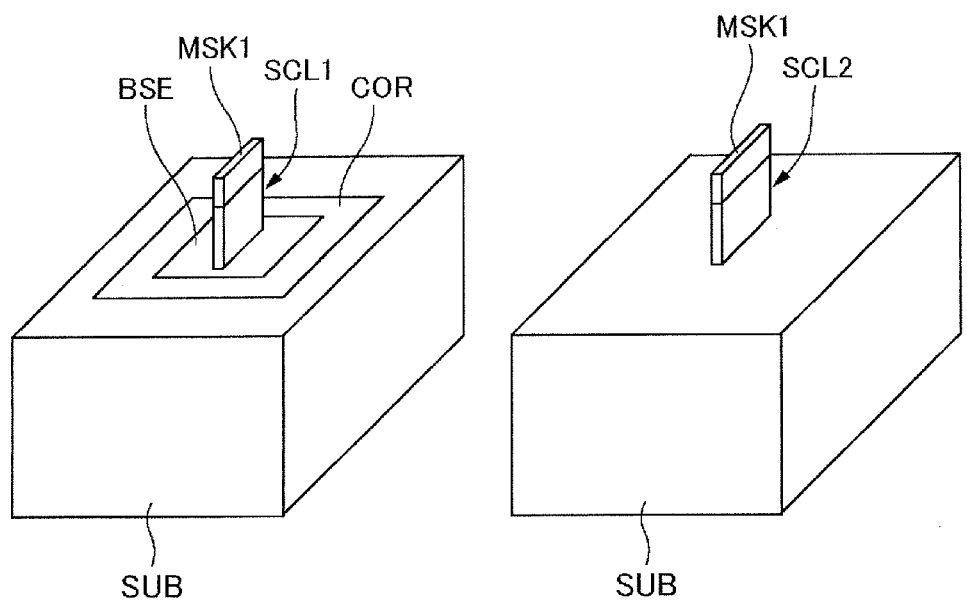
Figure 6B:
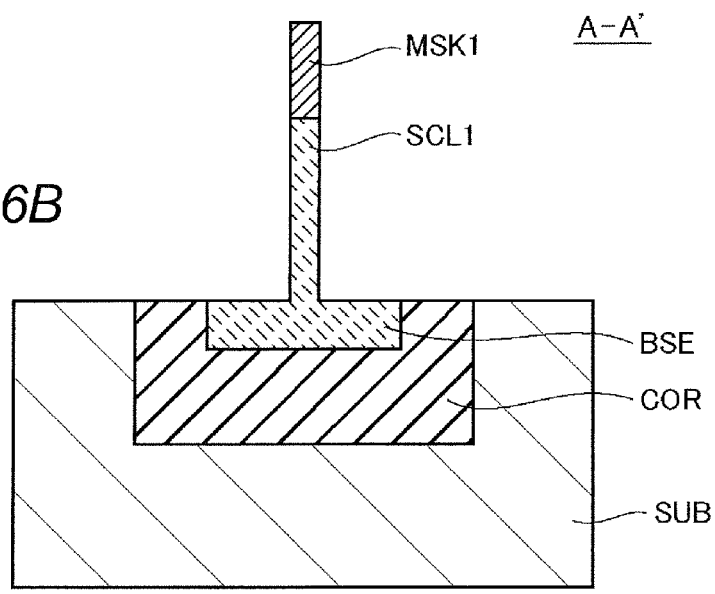

Then, the substrate SUB is dry-etched using the mask pattern MSK1 as a mask as shown in FIGS. 6A and 6B. Consequently, a first semiconductor layer SCL1 and a second semiconductor layer SCL2 are formed in the substrate SUB.

Figure 7A:
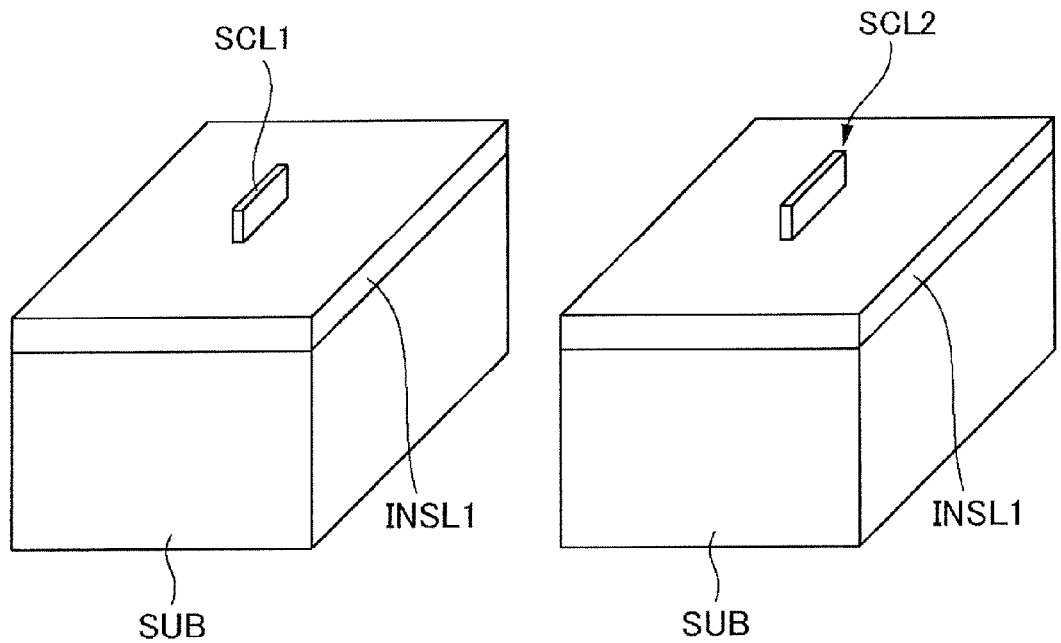
Figure 7B:
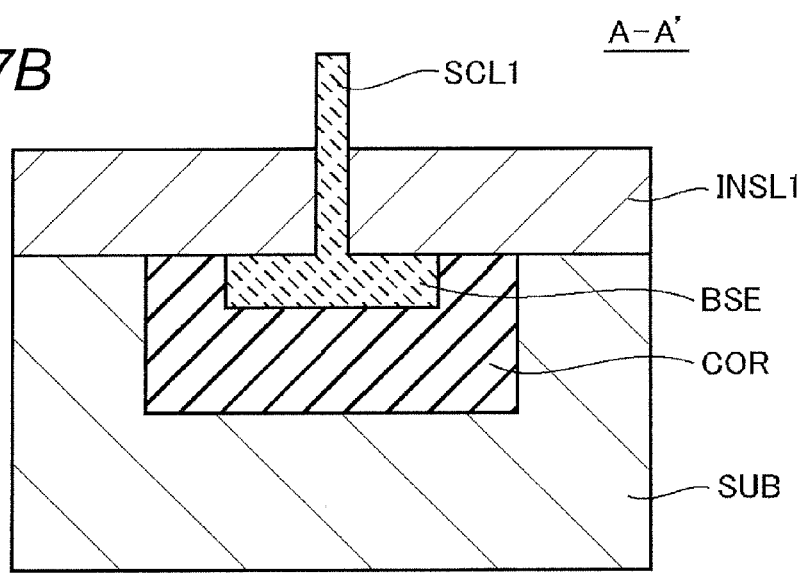

Then, an insulating film INSL1 is formed over the substrate SUB as shown in FIGS. 7A and 7B. The insulating film INSL1 is made by a deposition process such as CVD. The insulating film INSL1 is made so that it is thicker than the first semiconductor layer SCL1 and the second semiconductor layer SCL2. Then, the insulating film INSL1 is planarized by a CMP process and then the insulating film INSL1 is thinned by etching so that the upper portions of the first semiconductor layer SCL1 and second semiconductor layer SCL2 are exposed from the insulating film INSL1. Then, the mask pattern MSK1 is removed.

Figure 8A:
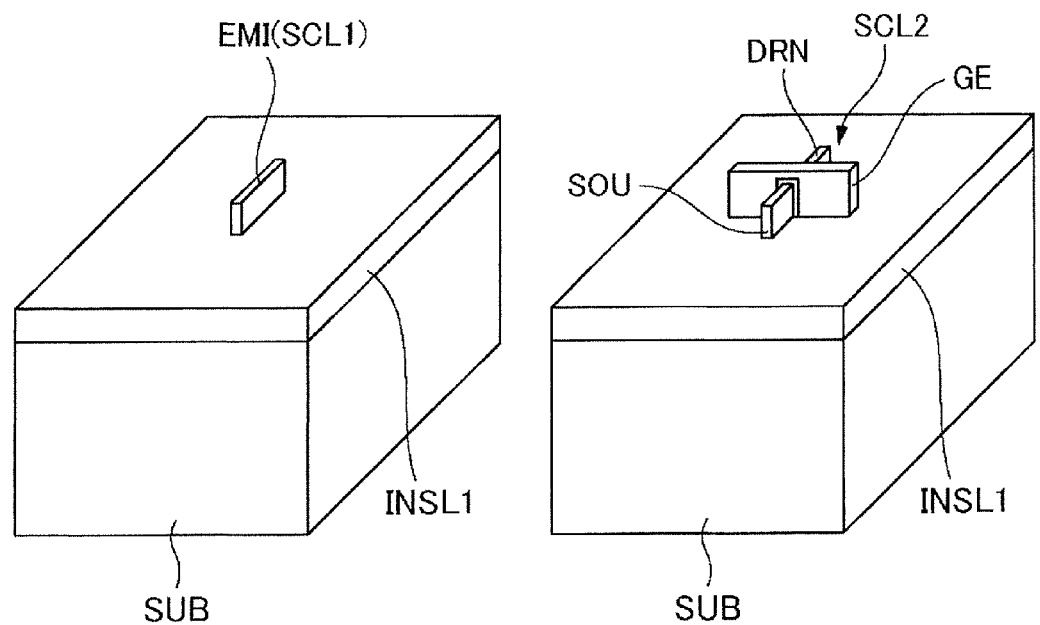
Figure 8B:
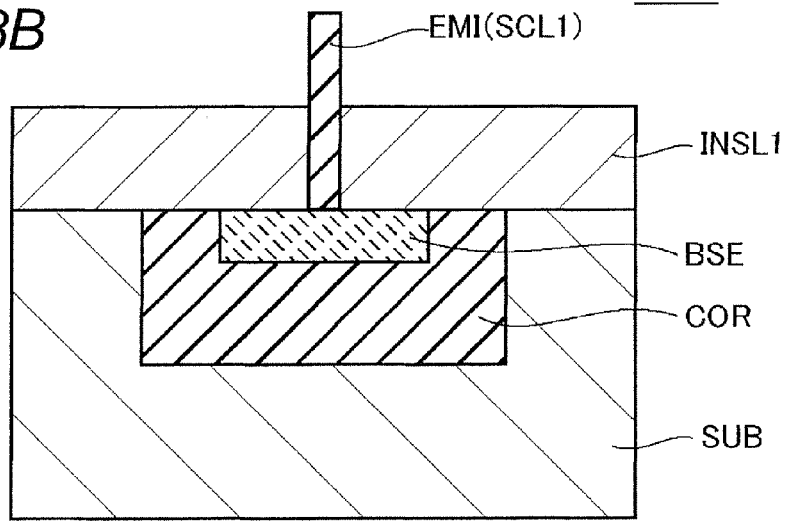

Then, a gate insulating film GINS is made on the second semiconductor layer SCL2 as shown in FIGS. 8A and 8B. The gate insulating film GINS is formed, for example, by a thermal oxidation process. In this case, a thermally oxidized film (not shown) is also made on the surface layer of the first semiconductor layer SCL1. Then, a conductive film (for example, polysilicon film) to become a gate electrode GE is made over the substrate SUB and the polysilicon film is selectively removed. Consequently, a gate electrode GE is formed. Then, impurities are implanted into the second semiconductor layer SCL2 using the gate electrode GE as a mask. Consequently, a source SOU and a drain DRN are formed in the second semiconductor layer SCL2.

If the source SOU and drain DRN are first-conductivity type impurity regions, first-conductivity type impurities are also implanted into the first semiconductor layer SCL1 in the step of forming the source SOU and drain DRN. Consequently, an emitter EMI is formed in the first semiconductor layer SCL1.

On the other hand, if the source SOU and drain DRN are second-conductivity type impurity regions, an emitter EMI is formed in an impurity implanting step other than the step of forming the source SOU and drain DRN. In this case, the first semiconductor layer SCL1 is covered by the resist pattern in the step of forming the source SOU and drain DRN. The second semiconductor layer SCL2 is covered by the resist pattern in the step of forming the emitter EMI.

If a plurality of field effect transistors FET are formed over the substrate SUB and some of them are of the first-conductivity type and the others are of the second-conductivity type, the emitter EMI is formed in the same step in which the sources SOU and drains DRN of the first-conductivity type field effect transistors FET are formed. In this case, the second semiconductor layer SCL2 which is used for the second-conductivity type field effect transistors FET is covered by the resist pattern in the step of forming the sources SOU and drains DRN of the first-conductivity type field effect transistors FET. On the other hand, the second semiconductor layer SCL2 and first semiconductor layer SCL1 which are used for the first-conductivity type field effect transistors FET are covered by the resist pattern in the step of forming the sources SOU and drains DRN of the second-conductivity type field effect transistors FET.

In any case, the dosage of impurities for the formation of an emitter EMI is, for example, not less than $1\times10^{14}$ cm$^2$ and not more than $1\times10^{16}$ cm$^2$.

Figure 9A:
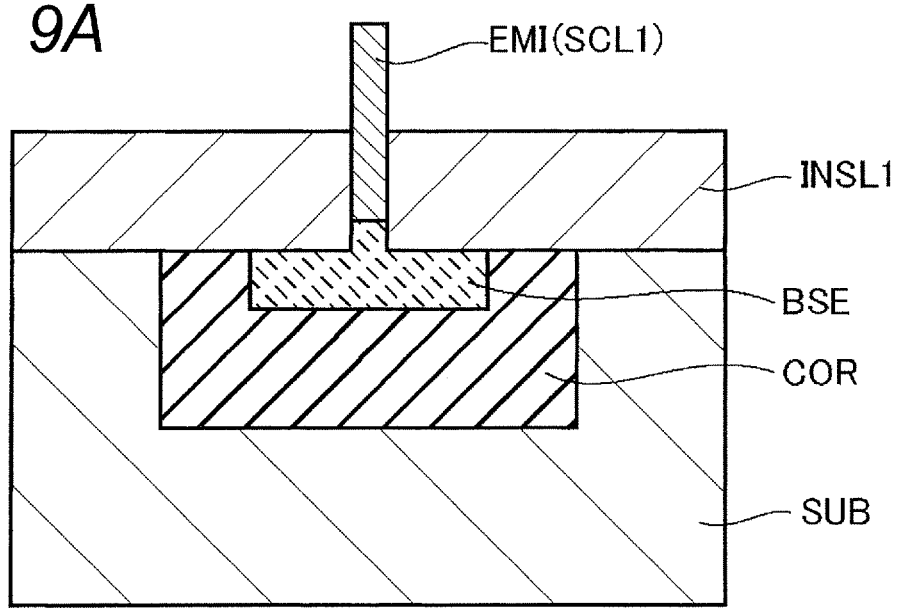
Figure 9B:
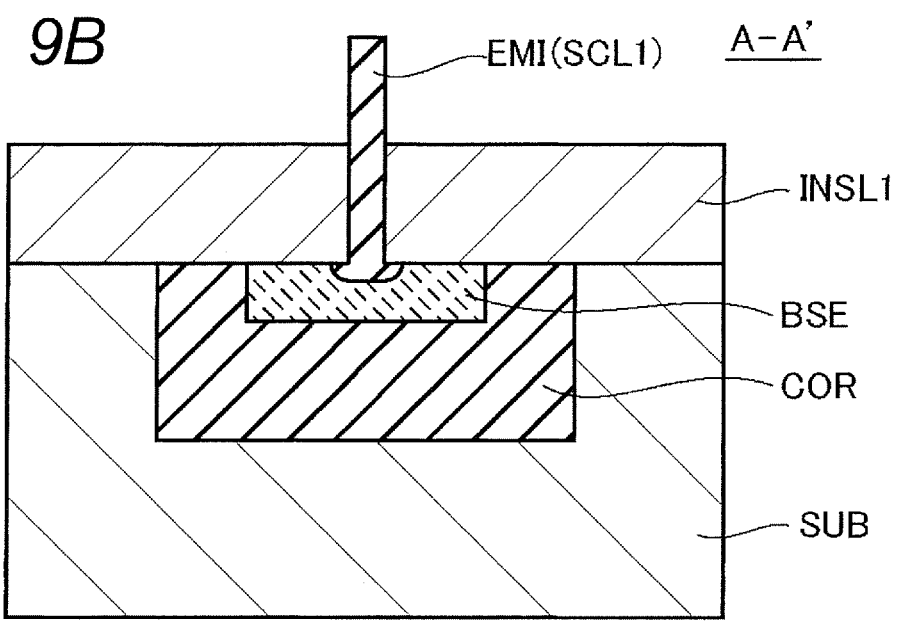

As shown in FIG. 8B, the emitter EMI occupies the entire first semiconductor layer SCL1 in the thickness direction and does not occupy any part of the substrate SUB other than the first semiconductor layer SCL1. Alternatively, as shown in FIG. 9A, the emitter EMI may partially occupy the first semiconductor layer CL1 in the thickness direction or as shown in FIG. 9B, it may occupy the first semiconductor layer SCL1 and extend to a portion of the substrate SUB which is joined to the first semiconductor layer SCL1. The area occupied by the emitter EMI can be changed, for example, by adjusting the energy for ion implantation.

As described above, according to this embodiment, a bipolar transistor BPT can be formed using a fin-type first semiconductor layer SCL1. Thus, the bipolar transistor BPT can be miniaturized. In addition, a second semiconductor layer SCL2 is formed in the same step in which the first semiconductor layer SCL1 is formed, and a fin-type field effect transistor FET is formed using the second semiconductor layer SCL2. Therefore, a fin-type bipolar transistor BPT and a fin-type field effect transistor FET can be formed over a substrate SUB in a fewer steps.

Second Embodiment

Figure 10:
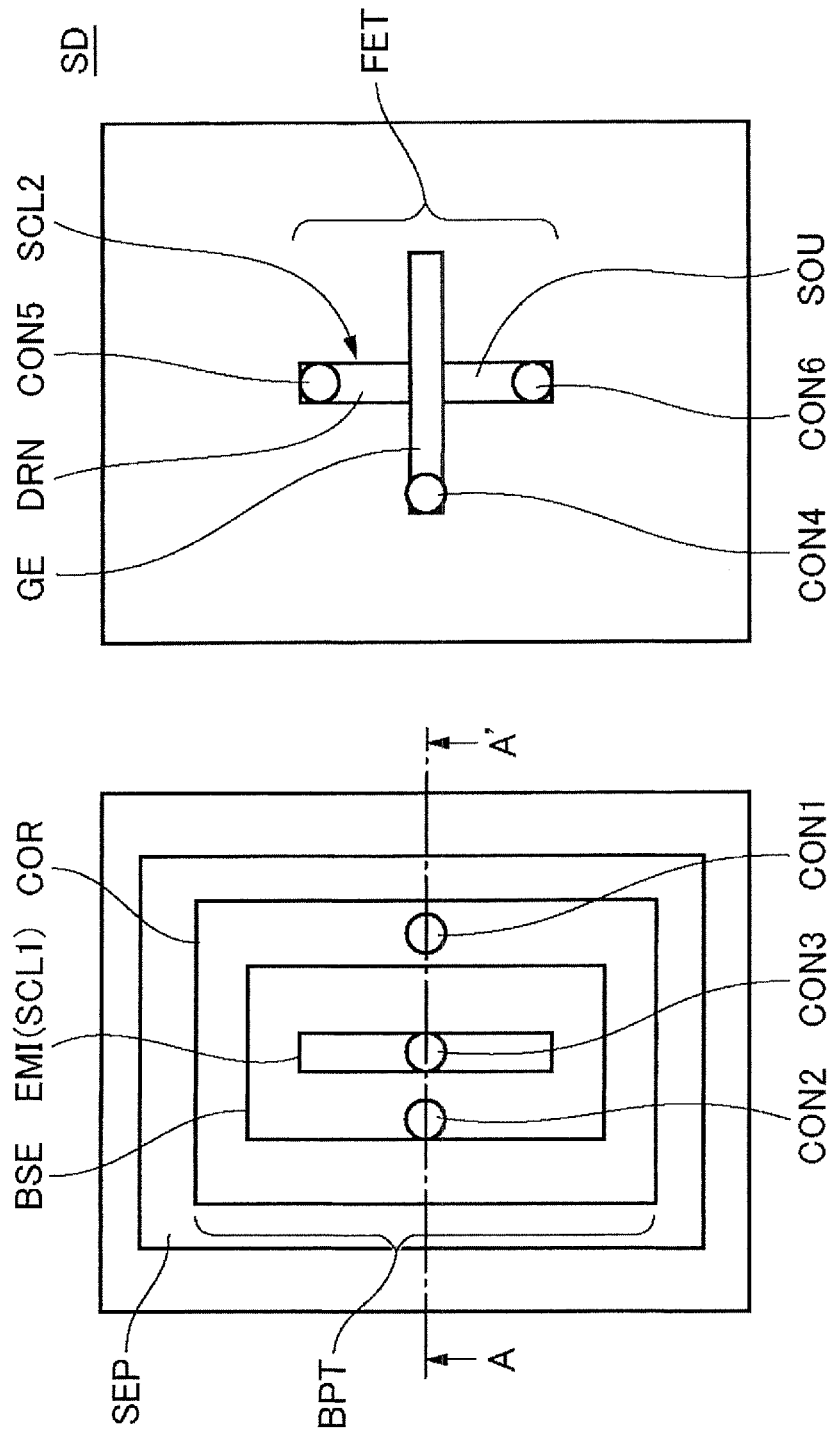
FIG. 10 is a plan view of a semiconductor device according to a second embodiment of the invention.
Figure 11:
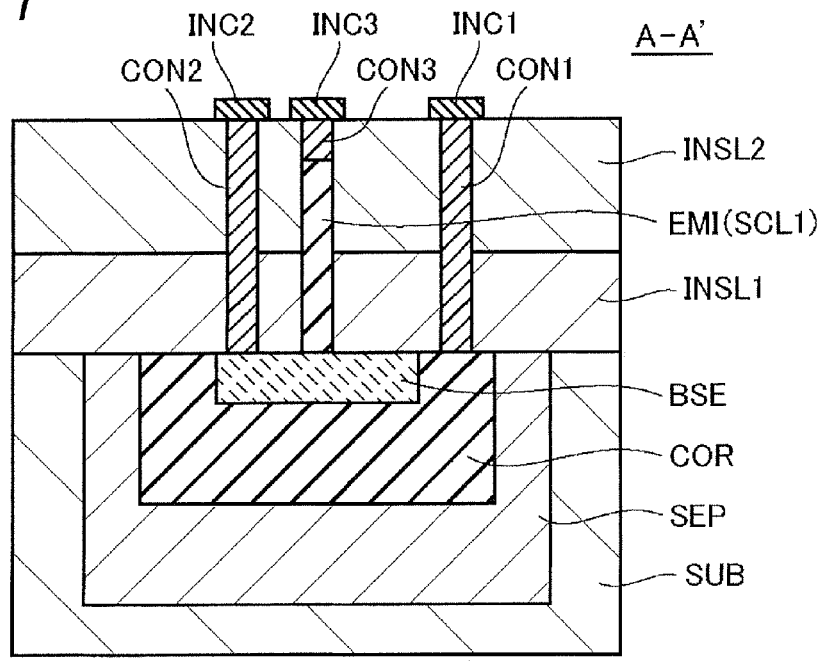
FIG. 11 is a sectional view taken along the line A-A' of FIG. 10.

FIG. 10 is a plan view of a semiconductor device SD according to the second embodiment and FIG. 11 is a sectional view taken along the line A-A' of FIG. 10. FIG. 10 corresponds to FIG. 2 for the first embodiment and FIG. 11 corresponds to FIG. 3 for the first embodiment. The semiconductor device SD according to this embodiment is structurally the same as the semiconductor device SD according to the first embodiment except the following points.

The first point is that the substrate SUB is of the first-conductivity type, or of the same conductivity type as the collector COR. The substrate SUB includes a separation region SEP to separate the collector COR from the substrate SUB electrically. The separation region SEP is a second-conductivity type impurity region which covers the side and bottom faces of the collector COR. In other words, the collector COR is formed in part of the separation region SEP.

The method for manufacturing the semiconductor device SD according to this embodiment is the same as the method for manufacturing the semiconductor device SD according to the first embodiment except that the separation region SEP is formed before (or after) the formation of the collector COR. The separation region SEP is formed, for example, by making a resist pattern on the substrate SUB and implanting impurities into the substrate SUB using the resist pattern as a mask. Here, the dosage of impurities is, for example, not less than $1\times10^{12}$ cm$^2$ and not more than $1\times10^{13}$ cm$^2$.

The second embodiment also brings about the same advantageous effects as the first embodiment. The bipolar transistor BPT in the first embodiment and the bipolar transistor BPT in the second embodiment may be formed on the same substrate SUB.

Third Embodiment

Figure 12:
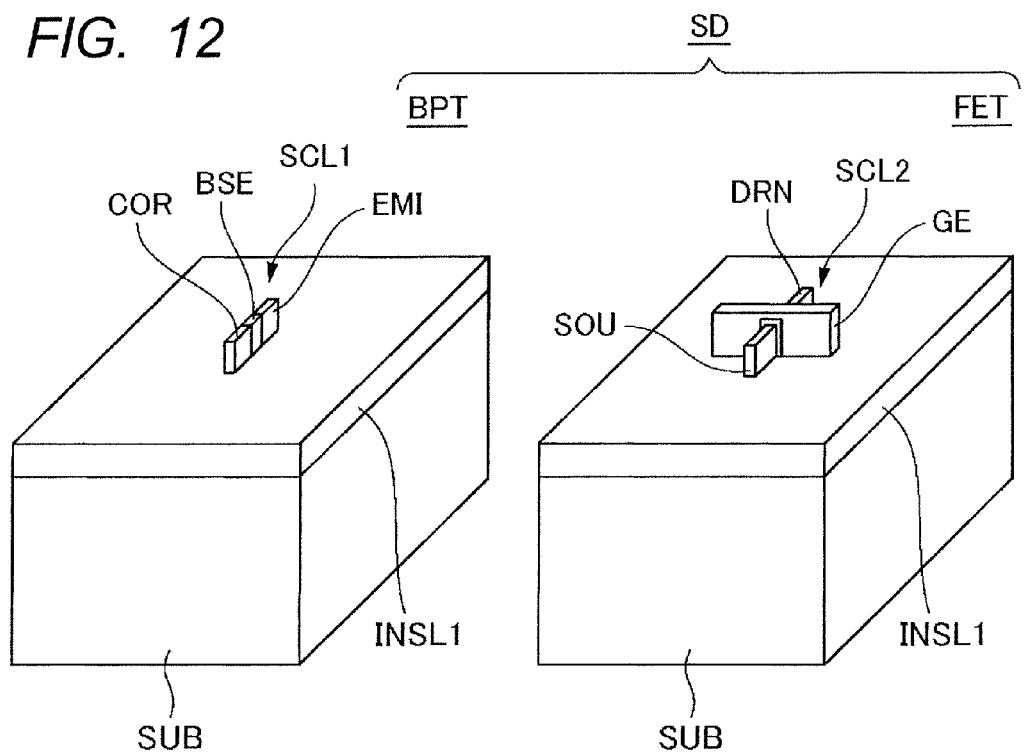
FIG. 12 is a perspective view showing the structure of a semiconductor device according to a third embodiment of the invention.
Figure 13:
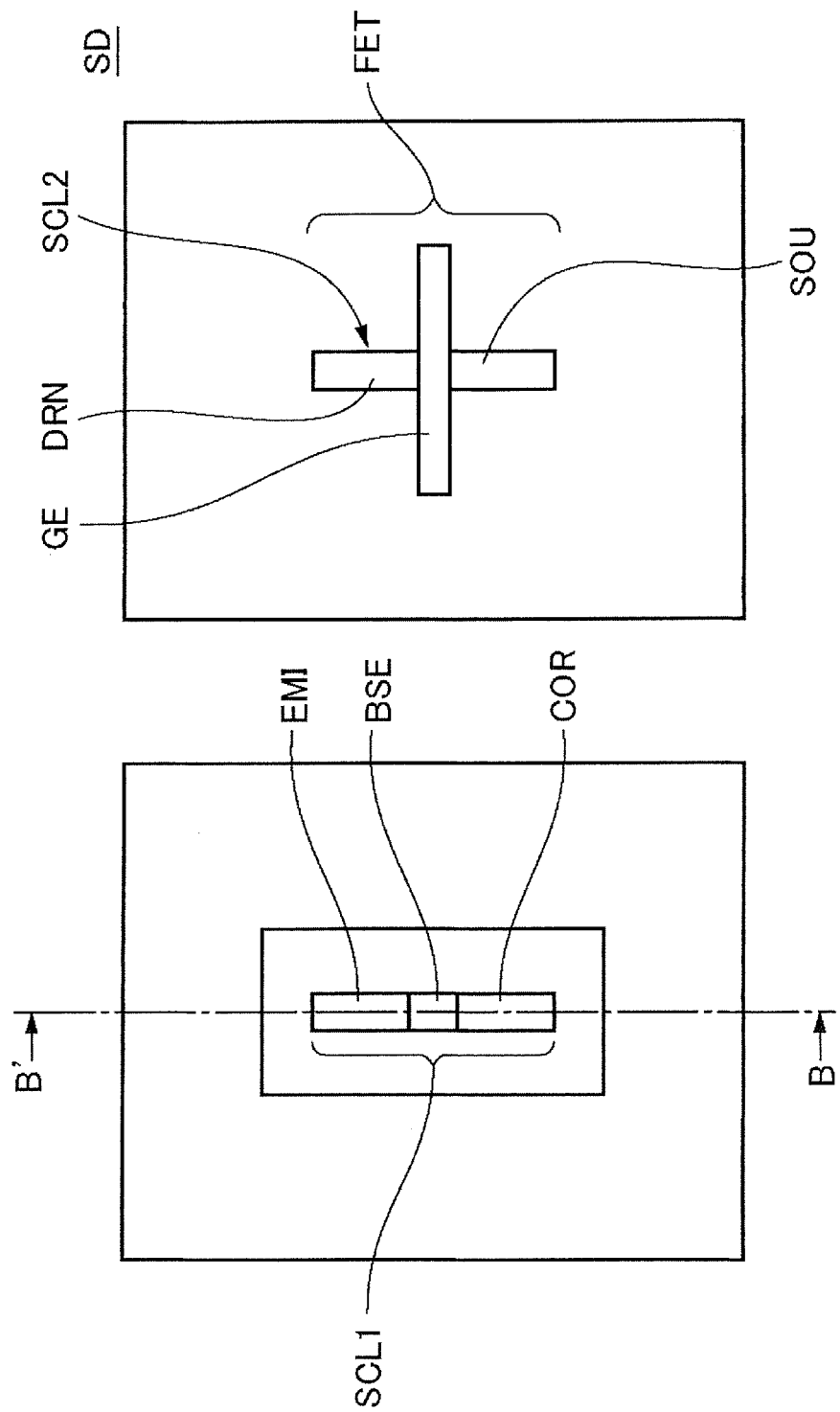
FIG. 13 is a plan view of the semiconductor device according to the third embodiment.
Figure 14:
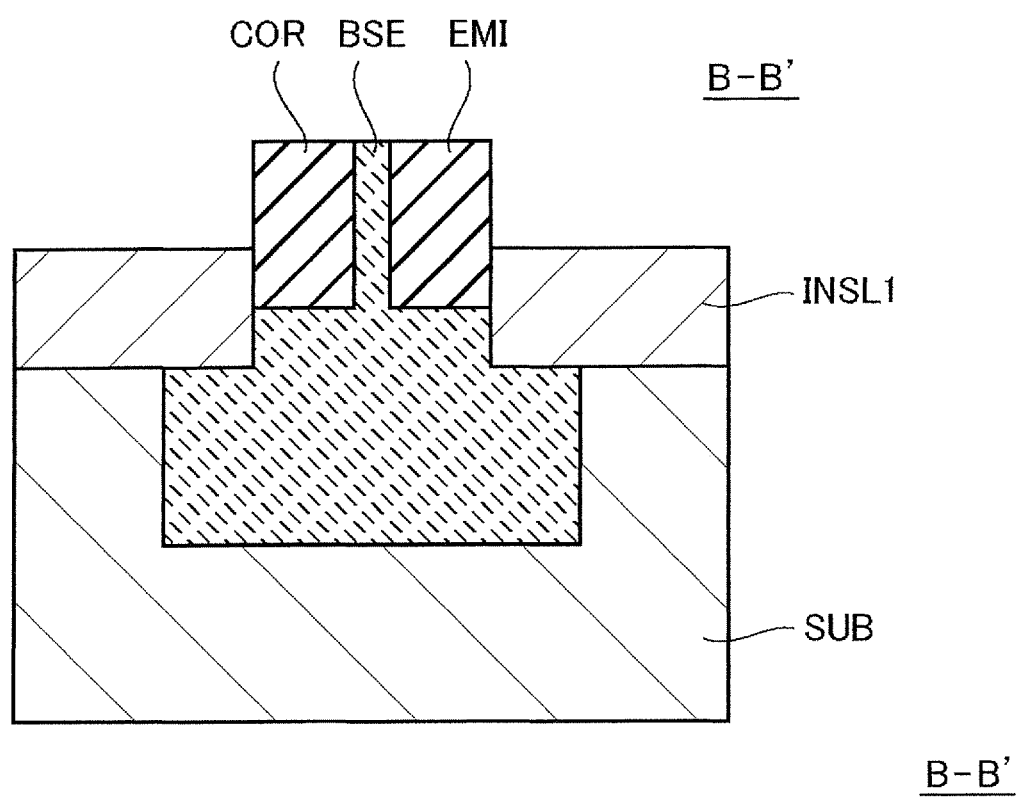
FIG. 14 is a sectional view taken along the line B-B' of FIG. 13.

FIG. 12 is a perspective view showing the structure of a semiconductor device SD according to the third embodiment. FIG. 13 is a plan view of the semiconductor device SD and FIG. 14 is a sectional view taken along the line B-B' of FIG. 13. FIGS. 12 to 14 correspond to FIGS. 1 to 3 for the first embodiment. In these figures, contacts are omitted. The semiconductor device SD according to the third embodiment is structurally the same as the semiconductor device SD according to the first embodiment except that the bipolar transistor BPT has a lateral structure.

Specifically, the base BSE, emitter EMI, and collector COR of the bipolar transistor BPT are all formed in the first semiconductor layer SCL1. The emitter EMI and the collector COR are spaced apart from each other. The base BSE is formed between the emitter EMI and the collector COR in the first semiconductor layer SCL1. In other words, the base BSE interconnects the emitter EMI and collector COR.

A portion of the base BSE lies in an area of the substrate SUB under the first semiconductor layer SCL1, but unlike the first embodiment, the collector COR does not lie there.

Figure 15A:
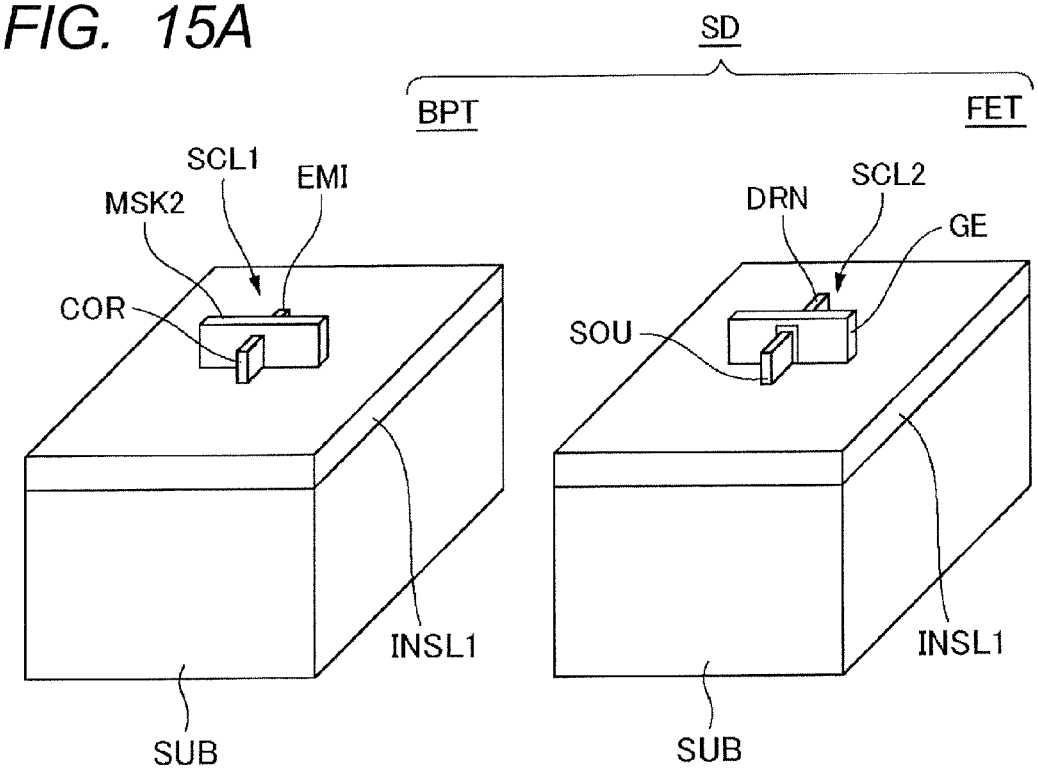
Figure 15B:
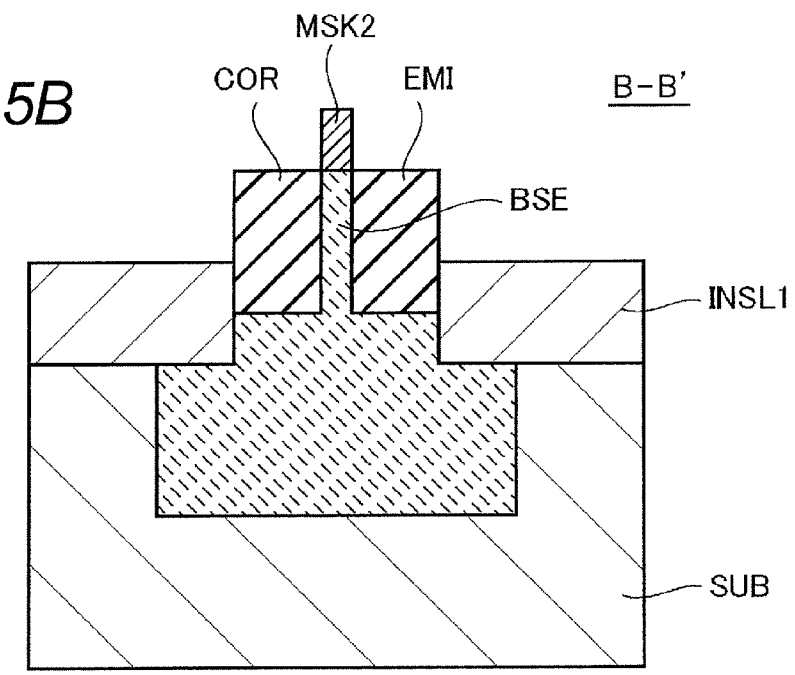

FIG. 15A is a perspective view for explaining the method for manufacturing the semiconductor device SD according to the third embodiment and FIG. 15B is a sectional view of the bipolar transistor part shown in FIG. 15A. The cross section shown in FIG. 15B corresponds to the cross section shown in FIG. 14. The method for manufacturing the semiconductor device SD according to this embodiment is the same as the method for manufacturing the semiconductor device SD according to the first embodiment except the following points.

The first point is that the collector COR is not formed before the first semiconductor layer SCL1 and second semiconductor layer SCL2 are formed (FIG. 4 for the first embodiment). However, the base BSE is formed in the same way as in the first embodiment. Thus, the first semiconductor layer SCL1 is of the second-conductivity type.

After the first semiconductor layer SCL1 is formed, the region of the first semiconductor layer SCL1 to become the base BSE is covered by a mask pattern MSK2, for example, a resist pattern. Then, first-conductivity type impurities are implanted into the first semiconductor layer SCL1 using the mask pattern MSK2 as a mask. Consequently, a collector COR and an emitter EMI are formed in the first semiconductor layer SCL1. When to make the mask pattern MSK2 and implant impurities into the first semiconductor layer SCL1 is the same as when to form the emitter EMI in the first semiconductor layer SCL1 in the first embodiment.

After that, the mask pattern MSK2 is removed.

Figure 16A:
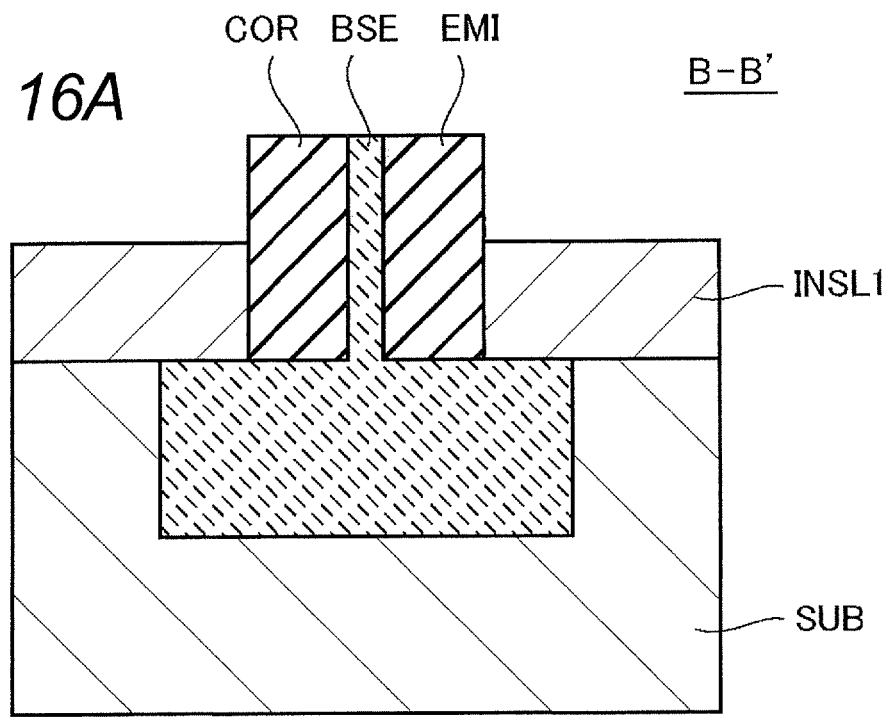
Figure 16B:
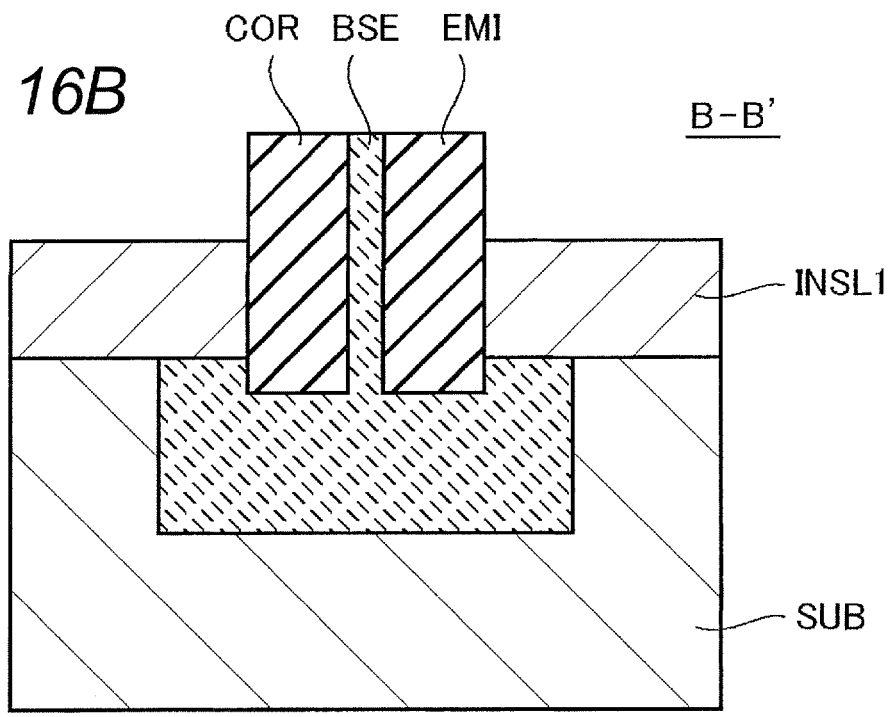

As shown in FIG. 14, the collector COR and emitter EMI partially occupy the first semiconductor layer SCL1 in the thickness direction. Alternatively, as shown in FIG. 16A, the collector COR and emitter EMI may be formed so as to extend throughout the first semiconductor layer SCL1 in the thickness direction and not occupy any region other than the first semiconductor layer SCL1. Also, as shown in FIG. 16B, the collector COR and emitter EMI may occupy the first semiconductor layer SCL1 and extend to a portion of the substrate SUB which is joined to the first semiconductor layer SCL1. The area occupied by the collector COR and emitter EMI can be changed, for example, by adjusting the energy for ion implantation.

According to this embodiment, a lateral bipolar transistor BPT can be formed using a fin-type first semiconductor layer SCL1.

Fourth Embodiment

Figure 17:
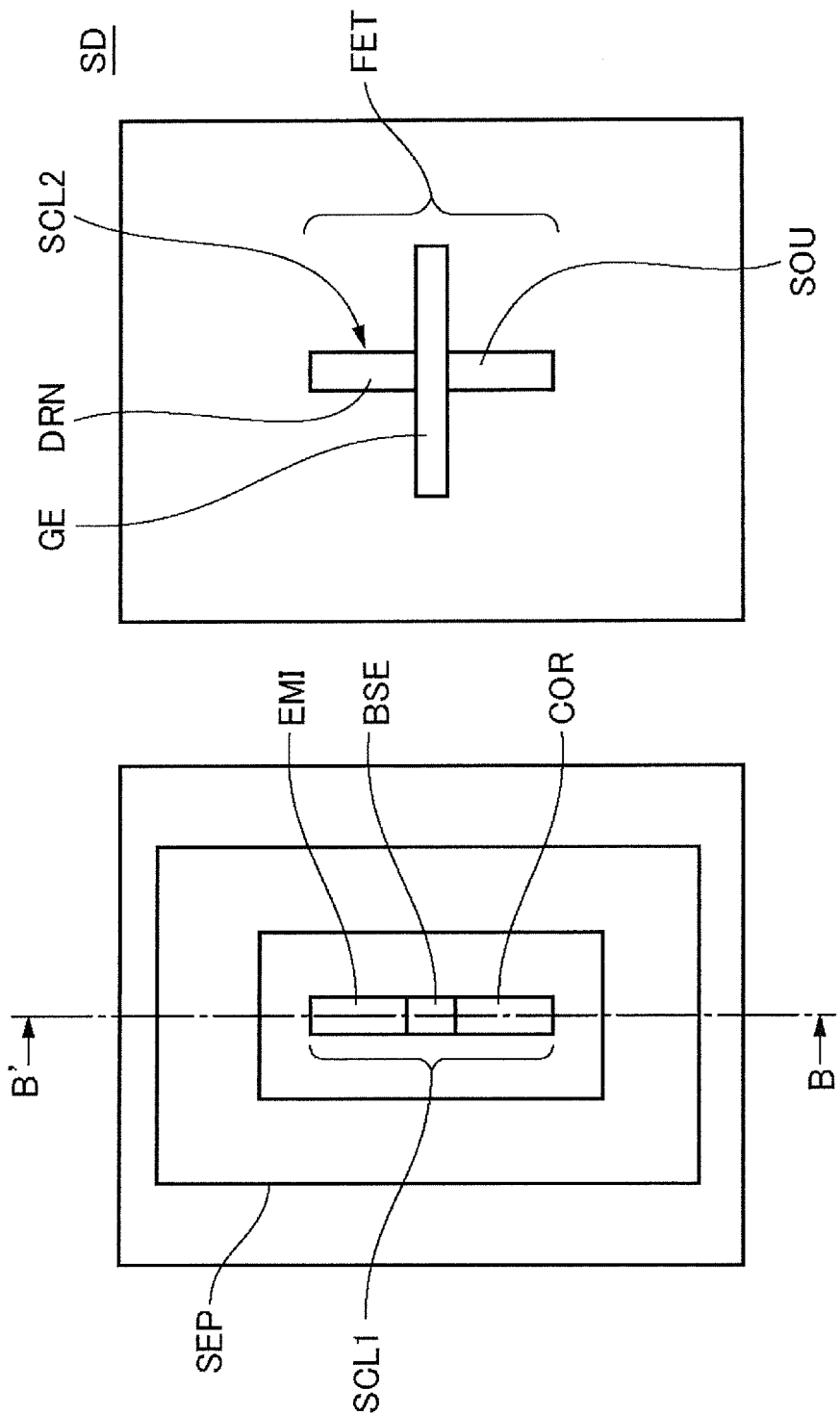
FIG. 17 is a plan view of a semiconductor device according to a fourth embodiment of the invention.
Figure 18:
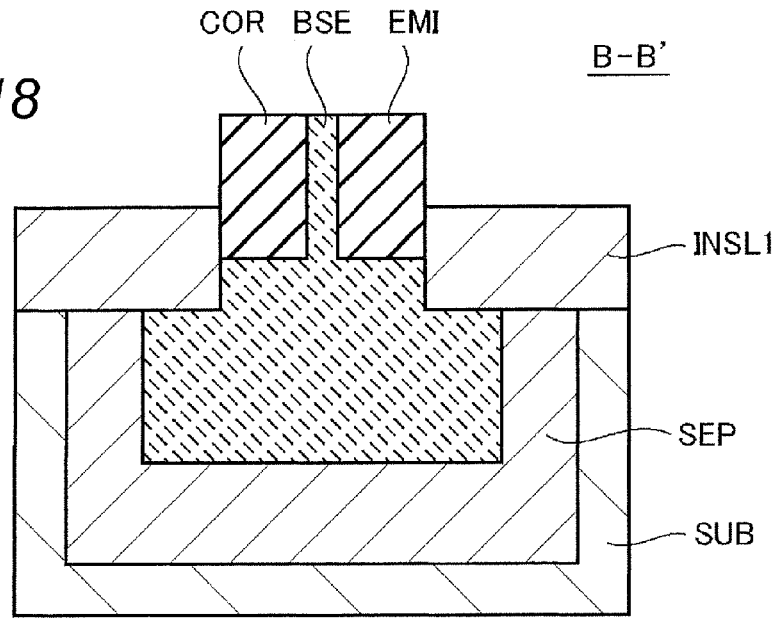
FIG. 18 is a sectional view taken along the line B-B' of FIG. 17.

FIG. 17 is a plan view of a semiconductor device SD according to the fourth embodiment and FIG. 18 is a sectional view taken along the line B-B' of FIG. 17. FIG. 17 corresponds to FIG. 13 for the third embodiment and FIG. 18 corresponds to FIG. 14 for the third embodiment. The semiconductor device SD according to this embodiment is structurally the same as the semiconductor device SD according to the third embodiment except the following points.

The first point is that the substrate SUB is of the first-conductivity type, or of the same conductivity type as the collector COR. The substrate SUB includes a separation region SEP to separate the collector COR from the substrate SUB electrically. Like the second embodiment, the separation region SEP is a second-conductivity type impurity region which covers the side and bottom faces of the collector COR. In other words, the collector COR is formed in part of the surface layer of the separation region SEP.

The method for manufacturing the semiconductor device SD according to this embodiment is the same as the method for manufacturing the semiconductor device SD according to the first embodiment except that the separation region SEP is formed before (or after) the formation of the base BSE. The separation region SEP is formed in the same way as in the second embodiment.

The fourth embodiment also brings about the same advantageous effects as the third embodiment. The bipolar transistor BPT in the third embodiment and the bipolar transistor BPT in the fourth embodiment may be formed on the same substrate SUB.

Fifth Embodiment

Figure 19:
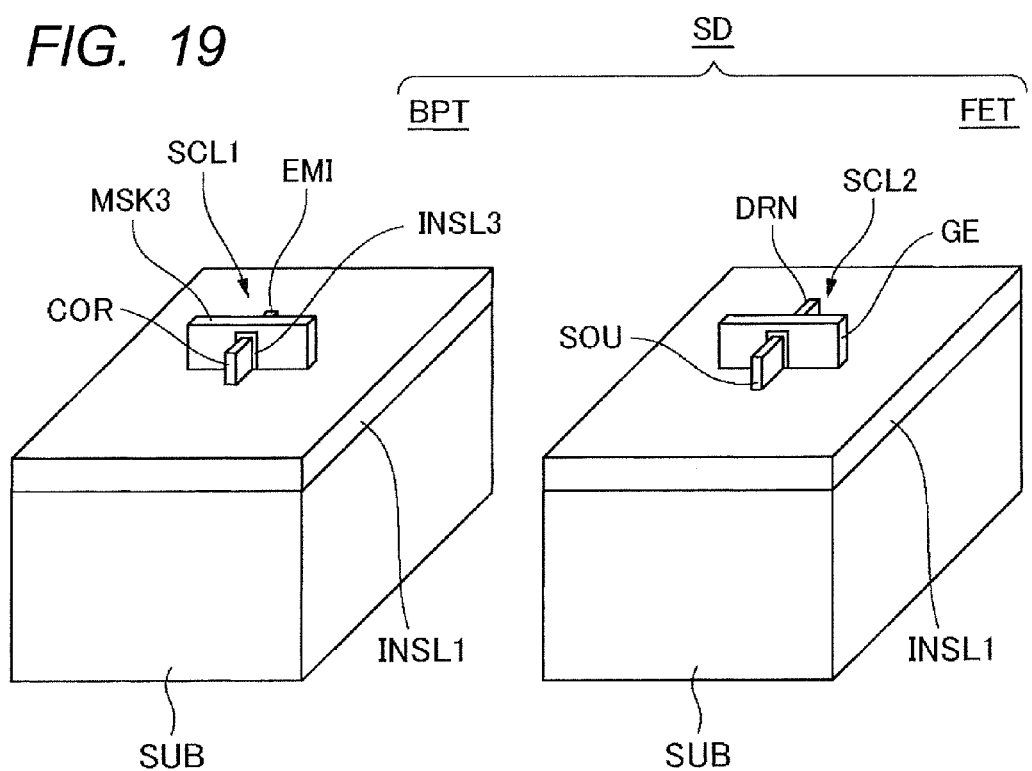
FIG. 19 is a perspective view showing the structure of a semiconductor device according to a fifth embodiment of the invention.
Figure 20:
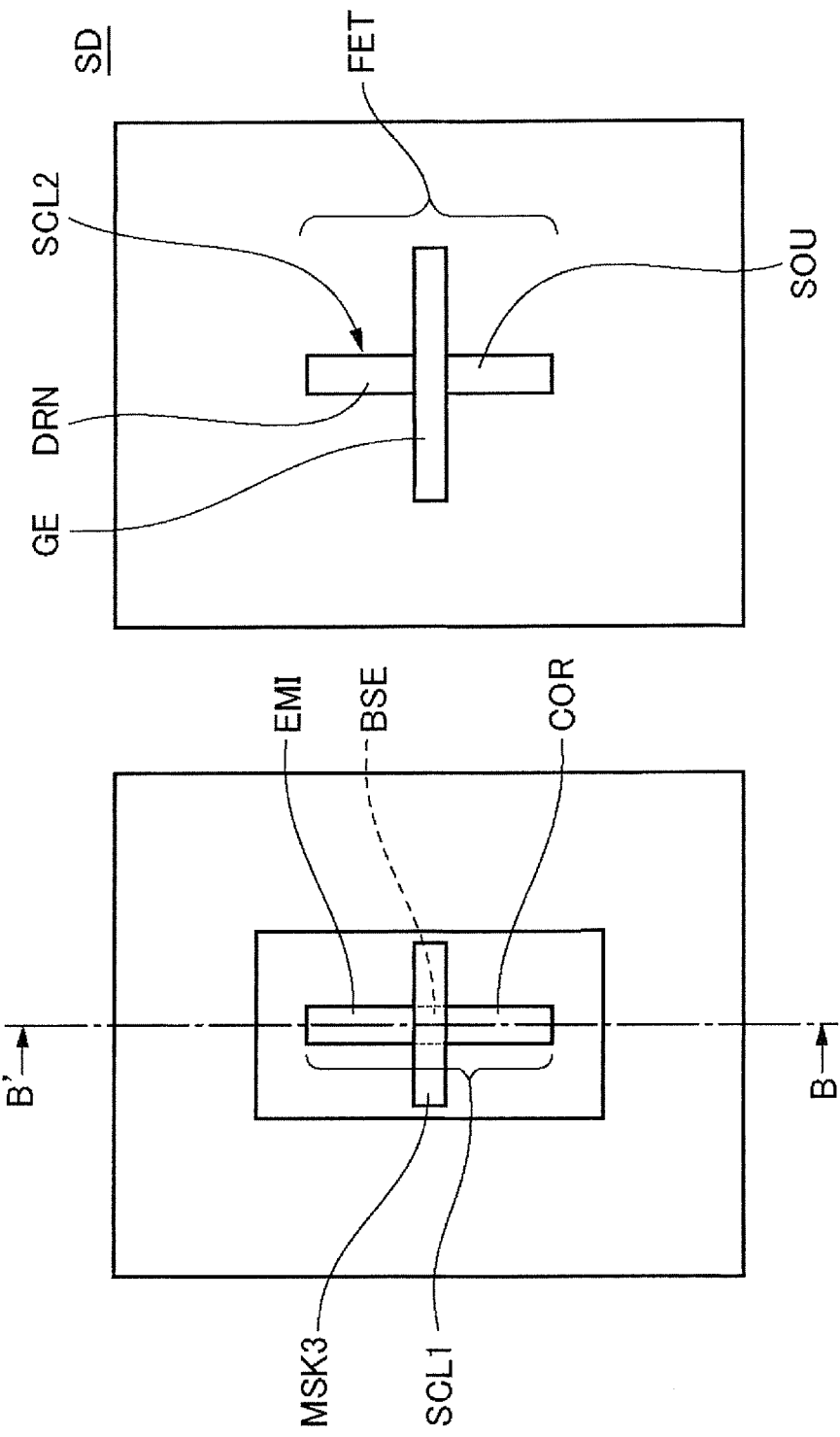
FIG. 20 is a plan view of the semiconductor device according to the fifth embodiment.
Figure 21:
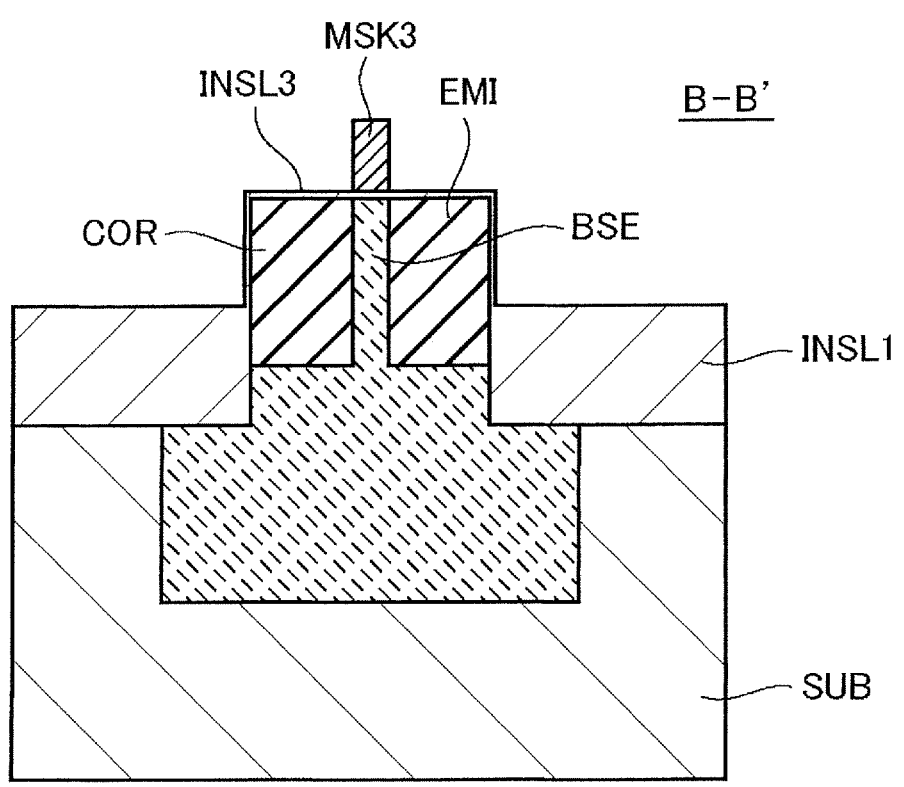
FIG. 21 is a sectional view taken along the line B-B' of FIG. 20.

FIG. 19 is a perspective view showing the structure of a semiconductor device SD according to the fifth embodiment. FIG. 20 is a plan view of the semiconductor device SD and FIG. 21 is a sectional view taken along the line B-B' of FIG. 20. FIGS. 19 to 21 correspond to FIGS. 12 to 14 for the first embodiment. The semiconductor device SD according to the fifth embodiment is structurally the same as the semiconductor device SD according to the third or fourth embodiment except that a mask pattern MSK3 is made on the bipolar transistor BPT. FIGS. 19 to 21 show a case that the semiconductor device is structurally the same as in the third embodiment.

The mask pattern MSK3 is used in place of the mask pattern MSK2 in the third and fourth embodiments. It functions as a mask in the step in which first-conductivity type impurities are implanted into the second-conductivity type first semiconductor layer SCL1 to form the collector COR and emitter EMI. Since the mask pattern MSK3 is made in the same step in which the gate electrode GE of the field effect transistor FET is formed, it is made of the same material as the gate electrode GE. An insulating film INSL3 which is the same as the gate insulating film GINS is made on the top and side faces of the first semiconductor layer SCL1.

Figure 22A:
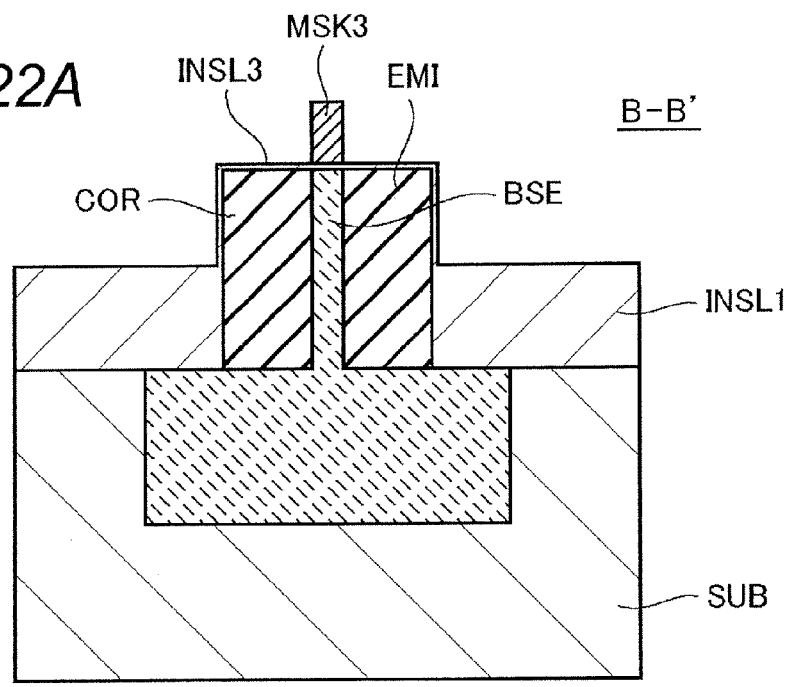
Figure 22B:
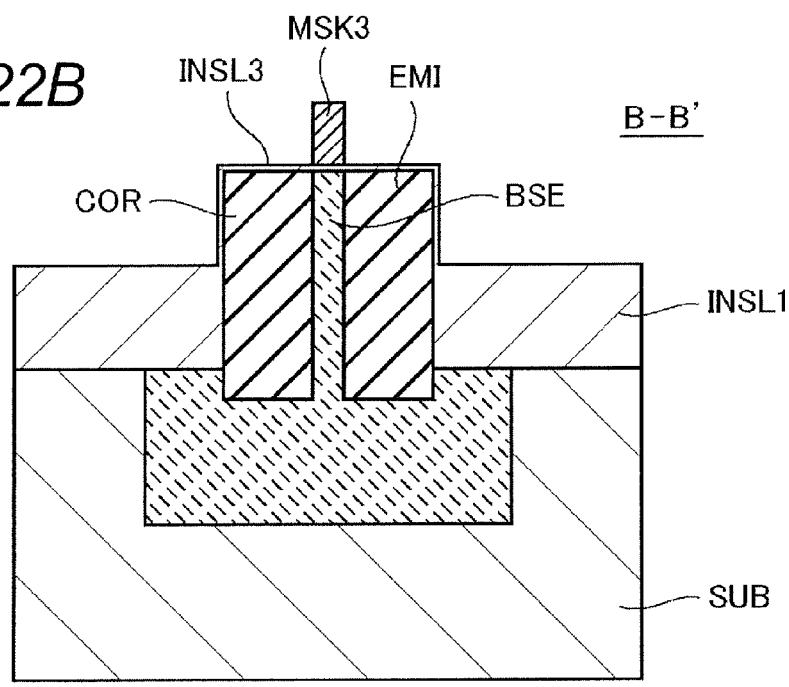

As shown in FIG. 21, the collector COR and emitter EMI partially occupy the first semiconductor layer SCL1 in the thickness direction. Alternatively, as shown in FIG. 22A, the collector COR and emitter EMI may be formed so as to extend throughout the first semiconductor layer SCL1 in the thickness direction and not occupy any region other than the first semiconductor layer SCL1. Also, as shown in FIG. 22B, the collector COR and emitter EMI may occupy the first semiconductor layer SCL1 and extend to a portion of the substrate SUB which is joined to the first semiconductor layer SCL1. The area occupied by the collector COR and emitter EMI can be changed, for example, by adjusting the energy for ion implantation.

The fifth embodiment also brings about the same advantageous effects as the third or fourth embodiment. Since the mask pattern MSK3 is made in the same step in which the gate electrode GE is formed, the number of steps for manufacturing the semiconductor device SD is decreased. In addition, since the width of the mask pattern MSK3 is almost equal to that of the gate electrode GE, the width of the mask pattern MSK3 can be decreased to decrease the width of the base BSE.

Sixth Embodiment

Figure 23:
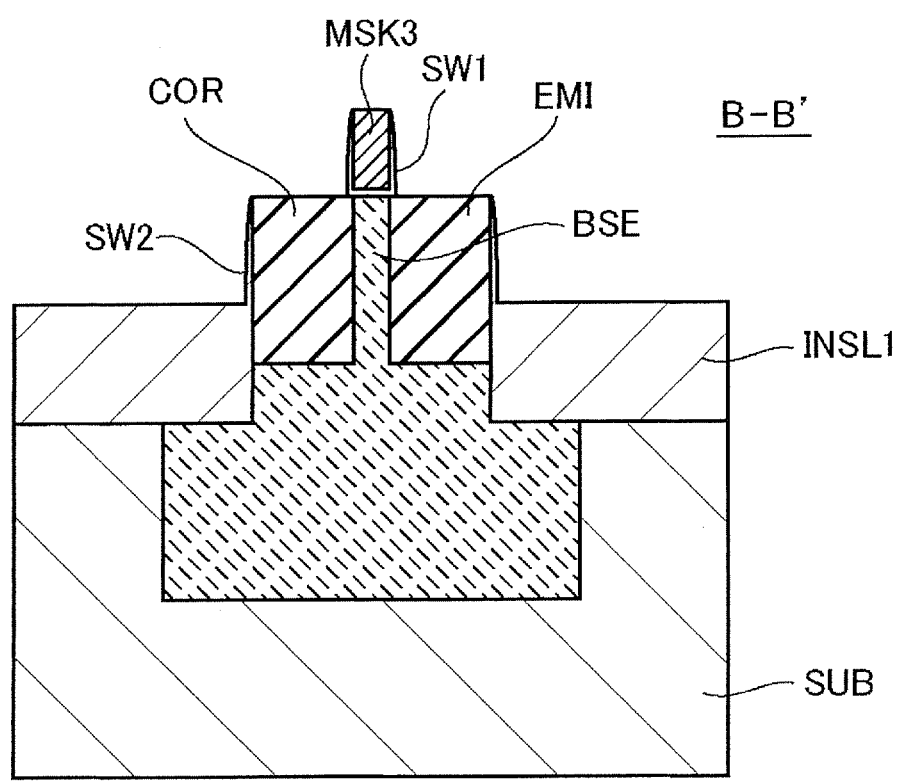
FIG. 23 is a sectional view showing the structure of a semiconductor device according to a sixth embodiment of the invention.

FIG. 23 is a sectional view showing the structure of a semiconductor device SD according to the sixth embodiment, which corresponds to FIG. 21 for the fifth embodiment. The semiconductor device SD according to this embodiment is structurally the same as the semiconductor device SD according to the fifth embodiment except the following points.

The first point is that a sidewall SW1 is made on the side face of the mask pattern MSK3 and a sidewall SW2 is made on the side face of the first semiconductor layer SCL1. Also, a sidewall SW1 is made on the side face of the gate electrode GE and a sidewall SW2 is made on the side face of the second semiconductor layer SCL2, though not shown in the figure.

An insulating film INSL3 is made only in the area of the first semiconductor layer SCL1 which is covered by the mask pattern MSK3, namely only over the base BSE.

The method for manufacturing the semiconductor device SD according to this embodiment is the same as the method for manufacturing the semiconductor device SD according to the fifth embodiment except that the step of making sidewalls SW1 and SW2 is taken after the steps of manufacturing the semiconductor device SD according to the fifth embodiment. The step of making sidewalls SW1 and SW2 includes the step of making an insulating film for sidewalls SW1 and SW2 and the step of etching back the insulating film to make sidewalls SW1 and SW2.

The sixth embodiment also brings about the same advantageous effects as the fifth embodiment.

Seventh Embodiment

Figure 24:
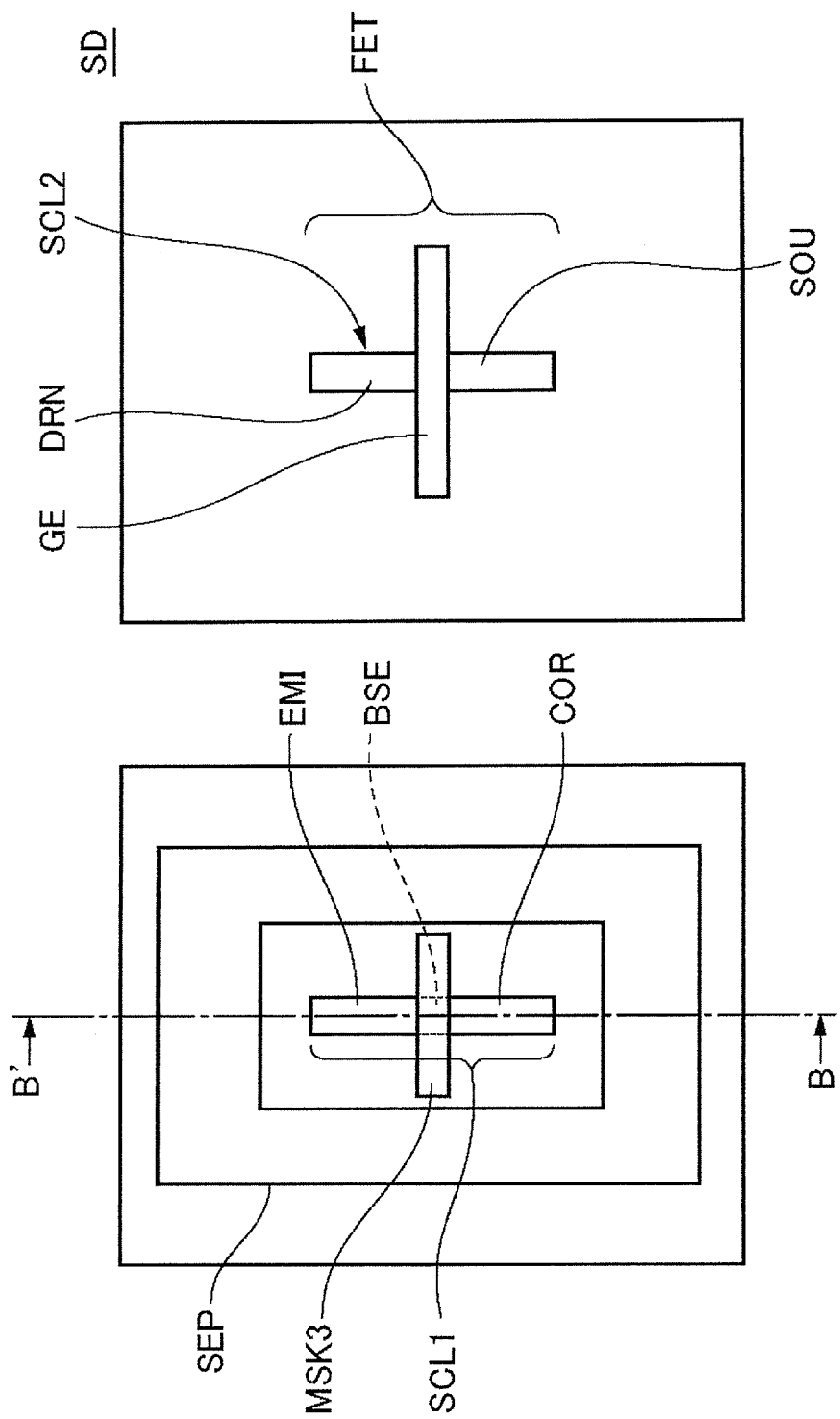
FIG. 24 is a plan view of a semiconductor device according to a seventh embodiment of the invention.
Figure 25:
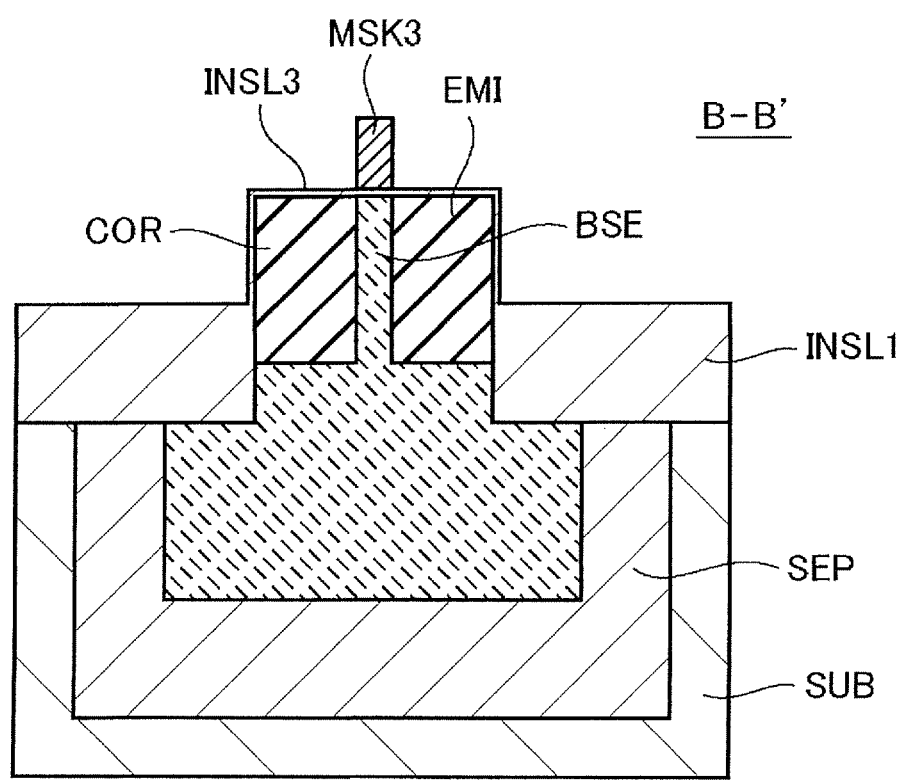
FIG. 25 is a sectional view taken along the line B-B' of FIG. 24.

FIG. 24 is a plan view of a semiconductor device SD according to the seventh embodiment and FIG. 25 is a sectional view taken along the line B-B' of FIG. 24. FIG. 24 corresponds to FIG. 20 for the fifth embodiment and FIG. 25 corresponds to FIG. 21 for the fifth embodiment. The semiconductor device SD according to this embodiment is structurally the same as the semiconductor device SD according to the fifth embodiment except the following points.

The first point is that the substrate SUB is of the first-conductivity type, or of the same conductivity type as the collector COR. The substrate SUB includes a separation region SEP to separate the collector COR from the substrate SUB electrically. Like the second embodiment, the separation region SEP is a second-conductivity type impurity region which covers the side and bottom faces of the collector COR. In other words, the collector COR is formed in part of the surface layer of the separation region SEP.

The method for manufacturing the semiconductor device SD according to this embodiment is the same as the method for manufacturing the semiconductor device SD according to the fifth embodiment except that the separation region SEP is formed before (or after) the formation of the base BSE. The separation region SEP is formed in the same way as in the second embodiment.

The seventh embodiment also brings about the same advantageous effects as the fifth embodiment. The bipolar transistor BPT in the fifth embodiment and the bipolar transistor BPT in the seventh embodiment may be formed on the same substrate SUB.

The invention made by the present inventors has been so far explained concretely in reference to the preferred embodiments thereof. However, the invention is not limited thereto and it is obvious that these details may be modified in various ways without departing from the spirit and scope thereof.

What is claimed is:

1. A semiconductor device comprising:
   a semiconductor substrate;
   a first first-conductivity type region formed in the semiconductor substrate;
   a second-conductivity type region formed in a surface layer of the first first-conductivity type region;
   a first semiconductor layer located over the second-conductivity type region;
   a second first-conductivity type region formed in the first semiconductor layer with a bottom thereof coupled to the second-conductivity type region;
   a first contact coupled to the first first-conductivity type region;
   a second contact coupled to the second-conductivity type region;
   a third contact coupled to the second first-conductivity type region, and
   a second-conductivity type separation region formed in the semiconductor substrate, surrounding side and bottom faces of the first first-conductivity type region,
   wherein the semiconductor substrate is of the first-conductivity type.

2. The semiconductor device according to claim 1, further comprising:
   a second semiconductor layer formed in a place different from the first semiconductor layer in the semiconductor substrate;
   a first impurity region formed in the second semiconductor layer and used as a source;
   a second impurity region formed in the second semiconductor layer, spaced apart from the first impurity region, and used as a drain;
   a gate insulating film formed between the first impurity region and the second impurity region in the second semiconductor layer; and
   a gate electrode formed over the gate insulating film.

3. A semiconductor device comprising:
   a semiconductor substrate;

a first first-conductivity type region formed in the semiconductor substrate;

a second-conductivity type region formed in a surface layer of the first first-conductivity type region;

a first semiconductor layer located over the second-conductivity type region;

a second first-conductivity type region formed in the first semiconductor layer with a bottom thereof coupled to the second-conductivity type region;

a first contact directly coupled to the first first-conductivity type region;

a second contact directly coupled to the second-conductivity type region; and a third contact directly coupled to the second first-conductivity type region.

4. The semiconductor device according to claim 3, wherein the semiconductor substrate is of the first-conductivity type, the device further comprising:

a second-conductivity type separation region formed in the semiconductor substrate, surrounding side and bottom faces of the first first-conductivity type region.

5. The semiconductor device according to claim 3, further comprising:

a second semiconductor layer formed in a place different from the first semiconductor layer in the semiconductor substrate;

a first impurity region formed in the second semiconductor layer and used as a source;

a second impurity region formed in the second semiconductor layer, spaced apart from the first impurity region, and used as a drain;

a gate insulting film formed between the first impurity region and the second impurity region in the second semiconductor layer; and a gate electrode formed over the gate insulating film.

* * * * *